United States Patent
Sonobe et al.

(10) Patent No.: US 11,942,127 B2
(45) Date of Patent: Mar. 26, 2024

(54) MAGNETIC MEMORY DEVICE AND MAGNETIC MEMORY APPARATUS

(71) Applicant: Samsung Electronics Co., Ltd., Suwon-si (KR)

(72) Inventors: Yoshiaki Sonobe, Fujisawa (JP); Takeshi Kato, Nagoya (JP)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 357 days.

(21) Appl. No.: 17/382,847

(22) Filed: Jul. 22, 2021

(65) Prior Publication Data
US 2022/0108737 A1    Apr. 7, 2022

(30) Foreign Application Priority Data
Oct. 1, 2020    (JP) .................. 2020-167193

(51) Int. Cl.
*G11C 11/00* (2006.01)
*G01R 33/09* (2006.01)
*G11C 11/16* (2006.01)
(Continued)

(52) U.S. Cl.
CPC .......... *G11C 11/161* (2013.01); *G01R 33/093* (2013.01); *G11C 11/1675* (2013.01);
(Continued)

(58) Field of Classification Search
CPC ..... G11C 11/16; G11C 11/1675; H10N 50/80; H10N 50/85; H10N 50/10
See application file for complete search history.

(56) References Cited

U.S. PATENT DOCUMENTS 9,830,968 B2    11/2017  Shimomura et al.
9,831,423 B2    11/2017  Kondo et al.
(Continued)

FOREIGN PATENT DOCUMENTS

| | | |
|---|---|---|
| JP | 2017-059593 A | 3/2017 |
| JP | 2017-059595 A | 3/2017 |

(Continued)

OTHER PUBLICATIONS

H. Yoda et al., 'Voltage-Control Spintronics Memory (VoCSM) Having Potentials of Ultra-Low Energy-Consumption and High-Density' *IEEE*, 27.6.4, 2016, pp. IEDM16-679-IEDM16-682.
(Continued)

*Primary Examiner* — Pho M Luu
(74) *Attorney, Agent, or Firm* — Harness, Dickey & Pierce, P.L.C.

(57) ABSTRACT

A magnetic memory device includes a spin orbit torque (SOT) generator configured to generate a SOT, and a vertical magnetic recording layer connected to a main surface of the SOT generator at one end thereof, and is configured to record information using a SOT generated by the SOT generator and a current flowing in the vertical magnetic recording layer in combination. The magnetic memory device includes an insulating layer on one end of the vertical magnetic recording layer in an extension direction of the vertical magnetic recording layer, and a fixed layer on the insulating layer in the extension direction of the vertical magnetic recording layer.

20 Claims, 18 Drawing Sheets

(51) Int. Cl.
*H10B 61/00* (2023.01)
*H10N 50/10* (2023.01)
*H10N 50/80* (2023.01)
*H10N 50/85* (2023.01)

(52) U.S. Cl.
CPC ............ *H10B 61/00* (2023.02); *H10N 50/10* (2023.02); *H10N 50/80* (2023.02); *H10N 50/85* (2023.02)

(56) References Cited

U.S. PATENT DOCUMENTS

| | | | |
|---|---|---|---|
| 9,941,468 B2 | 4/2018 | Fukami et al. | |
| 10,068,946 B2 | 9/2018 | Shimomura et al. | |
| 2017/0076770 A1 | 3/2017 | Daibou et al. | |
| 2020/0044141 A1* | 2/2020 | Yamada | H10N 50/80 |
| 2020/0243752 A1* | 7/2020 | Sasaki | H10B 99/00 |
| 2020/0303630 A1* | 9/2020 | Ichikawa | H10N 50/85 |

FOREIGN PATENT DOCUMENTS

| | | |
|---|---|---|
| JP | 2017-059634 A | 3/2017 |
| JP | 2017-059679 A | 3/2017 |
| JP | 2017-112351 A | 6/2017 |
| JP | 6178451 B1 | 8/2017 |
| JP | 2020-107790 A | 7/2020 |
| WO | WO-2016/021468 A1 | 2/2016 |

OTHER PUBLICATIONS

Seung-heon C. Baek et al., 'Spin currents and spin-orbit torques in ferromagnetic trilayers' *Nature Materials*, vol. 17, Jun. 2018, pp. 509-513.

S. Fukami et al., 'A spin-orbit torque switching scheme with collinear magnetic easy axis and current configuration' *Nature Nanotechnology*, Mar. 2016.

* cited by examiner

MAGNETIC MEMORY DEVICE AND MAGNETIC MEMORY APPARATUS

CROSS-REFERENCE TO RELATED APPLICATIONS

This application is based on and claims priority under 35 U.S.C. § 119 to Japanese Patent Application No. 2020-167193, filed on Oct. 1, 2020, in the Japanese Patent Office, the disclosure of which is incorporated by reference herein in its entirety.

BACKGROUND

Inventive concepts relate to a memory device, and more particularly, to a magnetic memory device including a non-volatile magnetic layer, and/or a magnetic memory apparatus.

As semiconductor products have become more compact, highly integrated, and multifunctional, there is a demand for high capacity data processing in a small area, and accordingly, there is a need for research on devices capable of miniaturizing patterns for high integration while increasing an operating speed of memory devices in semiconductor devices. Recently, for the pattern miniaturization of highly integrated devices, a new exposure technology or an expensive process technology may be required, and many studies on a new integration degree technology have been conducted. For example, magnetic memory devices including magnetic tunnel junction (MTJ) devices, such as magnetic random access memory (MRAM) devices, are emerging as a next-generation memory meeting the demands for high speed, low power consumption, and high integration.

SUMMARY

Inventive concepts relate to a new magnetic memory device capable of large capacity, multi-value, and small size and high density, and/or a magnetic memory apparatus.

According to an embodiment of inventive concepts, a magnetic memory device may include a vertical magnetic recording layer in which a length of an extension direction thereof is two times or more a cross-sectional length of the vertical magnetic recording layer in a direction perpendicular to the extension direction, an insulating layer on an upper surface of the vertical magnetic recording layer in the extension direction, and a fixed layer on the insulating layer in the extension direction.

According to an embodiment of inventive concepts, a magnetic memory device may include a vertical magnetic recording layer in which a length of an extension direction thereof is two times or more a cross-sectional length of the vertical magnetic recording layer in a direction perpendicular to the extension direction, a non-magnetic metal layer on an upper surface of the vertical magnetic recording layer in the extension direction, and a fixed layer on the non-magnetic metal layer in the extension direction.

According to an embodiment of inventive concepts, a magnetic memory apparatus may include a magnetic memory device and a controller. The magnetic memory device may include a vertical magnetic recording layer in which a length of an extension direction thereof is two times or more a cross-sectional length of the vertical magnetic recording layer in a direction perpendicular to the extension direction, a non-magnetic layer on an upper surface of the vertical magnetic recording layer in the extension direction, a fixed layer on the non-magnetic layer in the extension direction, a spin orbit torque (SOT) generator connected to a lower surface of the vertical magnetic recording layer and configured to generate a SOT, a first electrode and a second electrode connected to the SOT generator and configured to pass a current through the SOT generator in a direction perpendicular to a direction of the SOT, and a third electrode connected to the fixed layer and configured to pass a current through the vertical magnetic recording layer. The controller may be configured to control a current to flow in a direction corresponding to write information between the first electrode and the second electrode.

BRIEF DESCRIPTION OF THE DRAWINGS

Example embodiments of inventive concepts will be more clearly understood from the following detailed description taken in conjunction with the accompanying drawings in which.

DETAILED DESCRIPTION

Figure 1:
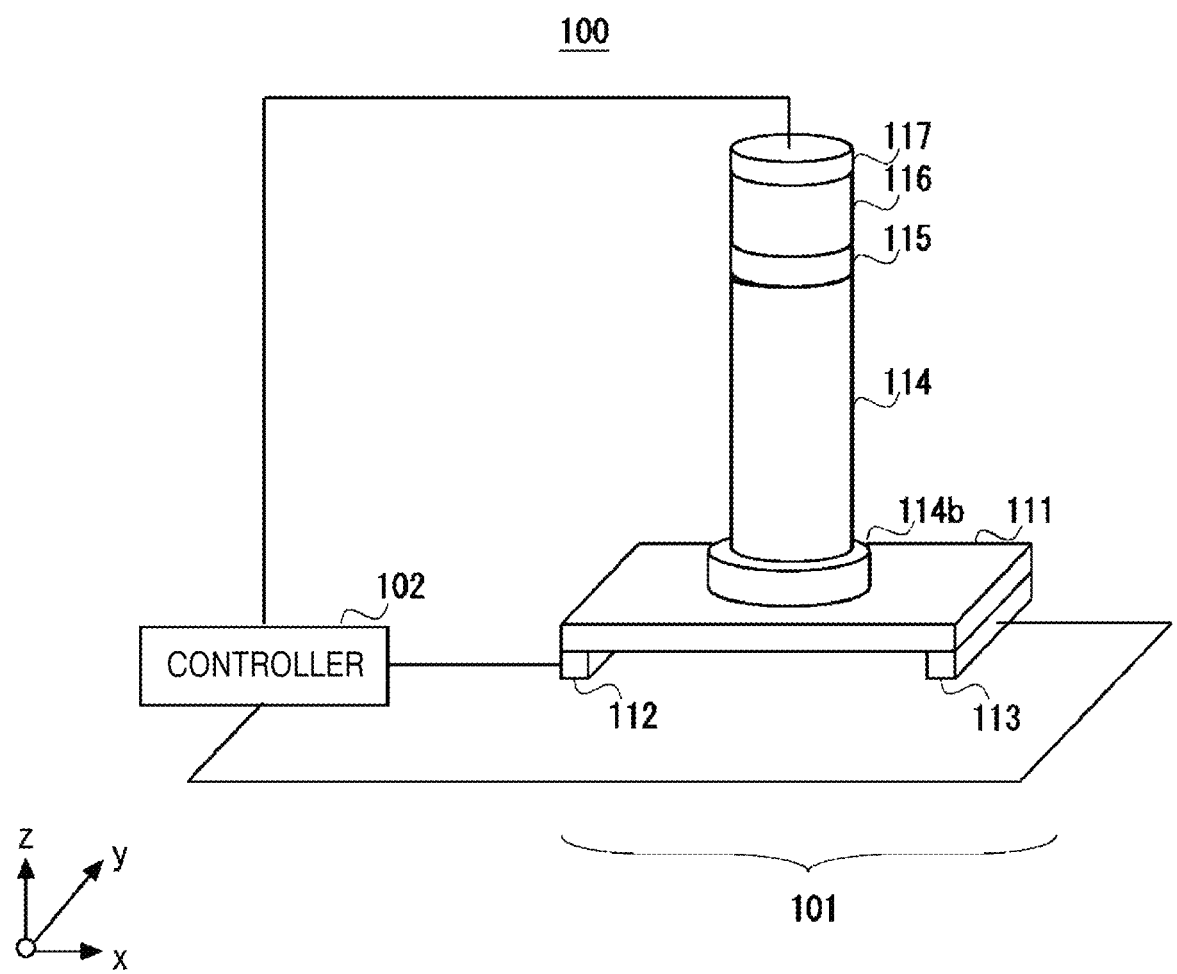
FIG. 1 is a perspective view of a magnetic memory apparatus according to an embodiment of inventive concepts.

Expressions such as "at least one of," when preceding a list of elements (e.g., A, B, and C), modify the entire list of elements and do not modify the individual elements of the list. For example, "at least one of A, B, and C," "at least one of A, B, or C," "one of A, B, C, or a combination thereof," and "one of A, B, C, and a combination thereof," respectively, may be construed as covering any one of the following combinations: A; B; A and B; A and C; B and C; and A, B, and C."

Hereinafter, embodiments of inventive concepts will be described in detail with reference to the accompanying drawings. Like components will be denoted by like reference numerals throughout the specification, and repeated descriptions thereof are omitted.

A spin-transfer torque MRAM (STT-MRAM), which is currently widely researched and developed, performs write and read operations on a magnetic tunnel junction (MTJ) device by a two-terminal structure, and thus, has a problem in that sufficient read margin cannot be obtained when highly integrated, and write tolerance is not obtained long enough. As a method capable of solving the problem and capable of writing at a high speed and low power consumption, spin orbit torque MRAM (SOT-MRAM) having a three-terminal structure in which writing is performed by generating a spin flow from a current using the spin hall effect (SHE) has attracted attention. For example, a patent document 'International Publication No. 2016/021468' and a non-patent document 'Fukami et al., Nature Nanotechh. 11, 621 (2016)' disclose an example of SOT-MRAM. In order to meet the demands for low power and high speed, a three-terminal MTJ device has been proposed in which write and read are separated by using a SOT recording rather than STT technology for writing. In addition, a non-patent document 'H. Yoda et al., IEDM27-6, 2016' proposes a voltage-control spintronics memory (VoCSM) technology combining voltage control and SOT (SHE) writing.

FIG. 1 is a perspective view of a magnetic memory apparatus 100 according to an embodiment of inventive concepts. In FIG. 1, a structure of a magnetic memory device is shown by a perspective view, and a circuit connecting to the magnetic memory device is shown by a schematic diagram.

Referring to FIG. 1, the magnetic memory apparatus 100 may include a magnetic memory device 101 and a controller 102. The magnetic memory device 101 may include a spin orbit torque (SOT) generator 111, a first electrode 112, a second electrode 113, a vertical magnetic recording layer 114, an insulating layer 115, a fixed layer 116, and a third electrode 117.

As shown in FIG. 1, the SOT generator 111, the vertical magnetic recording layer 114, the insulating layer 115, and the fixed layer 116 may be sequentially stacked. The SOT generator 111 may correspond to an electrode generating a SOT. The SOT generator 111 may be connected to the vertical magnetic recording layer 114 in a direction approximately perpendicular to a main surface thereof.

The SOT generator 111 may generate a SOT in a direction approximately perpendicular to the main surface thereof. In addition, the SOT generator 111 may generate a SOT in a lower portion 114b of the vertical magnetic recording layer 114. A direction of magnetization written in the vertical magnetic recording layer 114 by the SOT generated in the lower portion 114b of the vertical magnetic recording layer 114 from the SOT generator 111 and a current flowing in the vertical magnetic recording layer 114 may be memory information. In FIG. 1, a spin polarization direction of a spin injected into the lower portion 114b of the vertical magnetic recording layer 114 to provide a SOT is a y axis direction, and a direction of the SOT is the y axis direction within an x-y plane. A magnetization direction of the lower portion 114b of the vertical magnetic recording layer 114 may be changed by the SOT. In other words, a direction of the SOT generated by the SOT generator 111 and a direction of magnetization written in the vertical magnetic recording layer 114 (rewritable information) are perpendicular to each other, and the magnetization direction and a direction in which the vertical magnetic recording layer 114 extends may be parallel with each other. Specifically, the SOT generator 111 may generate a SOT by a current flowing between the first electrode 112 and the second electrode 113. The SOT generator 111 is generally a non-magnetic metal.

For example, the SOT generator 111 may include a topological insulator. The topological insulator may mean a material that behaves as an insulator in its interior but of which a surface transmits electricity. For example, the topological insulator includes a semi-metal bismuth and a bismuth compound. In particular, BiTeSb or BiSb may be used as a topological insulator. In addition, a composition of the topological insulator may be changed to make the interior thereof conductive. In addition, the SOT generator 111 may include at least one metal from among rhodium (Rh), platinum (Pt), tungsten (W), and tantalum (Ta). In addition, the SOT generator 111 may also include a combination of titanium (Ti) with a magnetic material such as NiFe or CoFeB, which are ferromagnetic materials. Specifically, the SOT generator 111 may include a composite layer of a CoFeB or NiFe layer and a Ti layer (S. C. Baek et al., Nat. Mater. 17 (2018) 509).

The first electrode 112 may be an electrode connected to one end of the SOT generator 111, and the second electrode 113 may be an electrode connected to the other end of the SOT generator 111. In addition, the first electrode 112 and the second electrode 113 may be connected to the controller 102 through an electrical line. The vertical magnetic recording layer 114 may be a magnetic body having magnetic anisotropy. The vertical magnetic recording layer 114 may be connected to the SOT generator 111 at one end thereof, and may be connected to the insulating layer 115 at the other end thereof.

In FIG. 1, the vertical magnetic recording layer 114 may be a recording layer extending in a z direction. In other words, a direction in which the vertical magnetic recording layer 114 extends may be perpendicular to a direction of a SOT generated by the SOT generator 111.

In addition, in the vertical magnetic recording layer 114, a length in a direction in which the vertical magnetic recording layer 114 extends from the SOT generator 111 to the insulating layer 115 may be twice or more (e.g., in a range of 2 to 10) a length of a cross-section perpendicular to the extension direction. Here, the length of the cross-section may mean a shortest length of the cross-section. For example, when the cross-section is rectangular, a length of a minor side thereof may be the length of the cross-section. In addition, when the cross-section is square, a length of one side thereof may be the length of the cross-section. Meanwhile, when the cross-section is circular, a diameter thereof may be the length of the cross-section. In addition, when the cross-section is an ellipse, a minor diameter (a diameter in a minor axis) thereof may be the length of the cross-section. For example, a length of a cross-section of the vertical magnetic recording layer 114 may be about 50 nm or less. In addition, a length of the extension direction of the vertical magnetic recording layer 114 may be, for example, 20 nm or greater. The vertical magnetic recording layer 114 may be a pillar-type vertical magnetic recording layer. In addition, the vertical magnetic recording layer 114 may include a ferromagnetic metal. The vertical magnetic recording layer 114 may be a vertical magnetic recording layer formed as a magnetic body having a thin and long shape. Due to the shape, the vertical magnetic recording layer 114 may be referred to as a magnetic wire.

Meanwhile, a current flows in the vertical magnetic recording layer 114, and the vertical magnetic recording layer 114 may function as a magnetic domain wall displacement type memory in which a magnetic domain wall (a boundary of a section having a desired and/or alternatively predetermined magnetization direction) moves. Specifically, a current may flow in the vertical magnetic recording layer 114 to generate an STT. In addition, a current may flow in the SOT generator 111 arranged under an end of the vertical magnetic recording layer 114 to generate a SOT in the lower portion 114b of the vertical magnetic recording layer 114. By the combination of the STT and the SOT, a magnetic domain wall and a magnetic domain may be recorded in the vertical magnetic recording layer 114. For example, the vertical magnetic recording layer 114 may include a transition metal/precious metal multilayer, such as a Co/Ni multilayer, a CoNi-based alloy, a Co/Pd multilayer, a CoPd alloy, a Co/Pt multilayer, a CoPt alloy, an Fe/Pd, CoFe/Pd, Co—Ni/Pd multilayer (the transition metal includes Fe, Co, Ni, and any alloys thereof, and the precious metal includes Pt, Pd, Au, Ir, and any alloys thereof), a Tb/FeCo multilayer, a Gd/FeCo multilayer, a Tb—Gd/FeCo multilayer, a TbFeCo alloy, a CoFe alloy, a CoFeB alloy, an Fe/Ni multilayer, or an FeNi alloy. The vertical magnetic recording layer 114 may take a variety of different shapes. The vertical magnetic recording layer 114 shown in FIG. 1 is a vertical magnetic recording layer formed as a magnetic body having a thin and long shape and may extend on a straight line (here, the z axis). A cross-section of the vertical magnetic recording layer 114 may take a variety of cross-sectional shapes.

For example, the cross-section of the vertical magnetic recording layer 114 may have a circular or quadrilateral shape.

The insulating layer 115 may be structurally connected to the vertical magnetic recording layer 114 at one end thereof. In addition, the insulating layer 115 may be connected to the fixed layer 116a at the other end thereof. In addition, the insulating layer 115 may be a non-magnetic insulator and a layer having an insulating material as a main component. For example, the insulating layer 115 may include an insulating layer of magnesium oxide (MgO) and the like.

In addition, a material of the insulating layer 115 may be an oxide having a sodium chloride (NaCl) structure, and may include calcium oxide (CaO), strontium oxide (SrO), titanium oxide (TiO), vanadium oxide (VO), niobium oxide (NbO), and the like, in addition to the MgO described above. However, the insulating layer 115 is not particularly limited thereto, as long as functions of the insulating layer 115 are the same. As the material, for example, $Al_2O_3$, a spinel type $MgAl_2O_4$, and the like may be used. In the present embodiment, the vertical magnetic recording layer 114, the insulating layer 115, and the fixed layer 116 may be included in a tunneling magnetoresistance (TMR) device, but instead of the insulating layer 115, a giant magnetoresistance (GMR) device may be configured by metal such as copper (Cu) and the like. The fixed layer 116 may be a ferromagnetic body having vertical magnetic anisotropy. In other words, the fixed layer 116 may be a layer having magnetic anisotropy that is parallel with an extension direction of the vertical magnetic recording layer 114. The fixed layer 116 may be structurally connected to the insulating layer 115 at one end thereof. In addition, the fixed layer 116 may be connected to the third electrode 117 at the other end.

The fixed layer 116 may be a ferromagnetic metal layer with a fixed magnetization direction. For example, the fixed layer 116 may include an iron (Fe)-based material such as CoFeB, CoFe, and the like, a Co/Pt multilayer, a TbFeCo-based material, or any combinations thereof. The vertical magnetic recording layer 114, the insulating layer 115, and the fixed layer 116 described above may be included in the TMR device. The third electrode 117 may be an electrode connected to the fixed layer 116. In addition, the third electrode 117 may be connected to the controller 102 through an electrical line. The controller 102 may write and read information in and from the magnetic memory device 101. In addition, the controller 102 may move information within the vertical magnetic recording layer 114.

This operation may be implemented by applying a voltage or supplying a current between the first electrode 112, the second electrode 113, and the third electrode 117. The controller 102 may change, according to write information, a direction of current flowing between the first electrode 112 and the second electrode 113.

For example, when a binary 0 is written in the magnetic memory device 101, the controller 102 may control a current to flow from the first electrode 112 to the second electrode 113. Alternatively, when a binary 1 is written in the magnetic memory device 101, the controller 102 may control a current to flow from the second electrode 113 to the first electrode 112. Meanwhile, a binary value and a direction of a current may be reversed.

The controller 102 may apply a voltage between the first electrode 112 and the third electrode 117 and measure a current flowing between the third electrode 117 and the first electrode 112, so as to read a magnetization direction (e.g., a value of written information) of the vertical magnetic recording layer 114. The controller 102 may control a current (sense current) to flow between the first electrode 112 and the third electrode 117, and measure a voltage (an electric potential difference) between the first electrode 112 and the third electrode 117, so as to read a magnetization direction (e.g., a value of written information) of the vertical magnetic recording layer 114. By the configuration described above, the magnetic memory apparatus 100 may write and read data. An operation in which the controller 102 writes information in the magnetic memory device 101 and an operation of moving information within the vertical magnetic recording layer 114 will now be described below.

FIGS. 2 to 6 are conceptual diagrams illustrating an operation of the magnetic memory apparatus 100 in FIG. 1.

Figure 2:
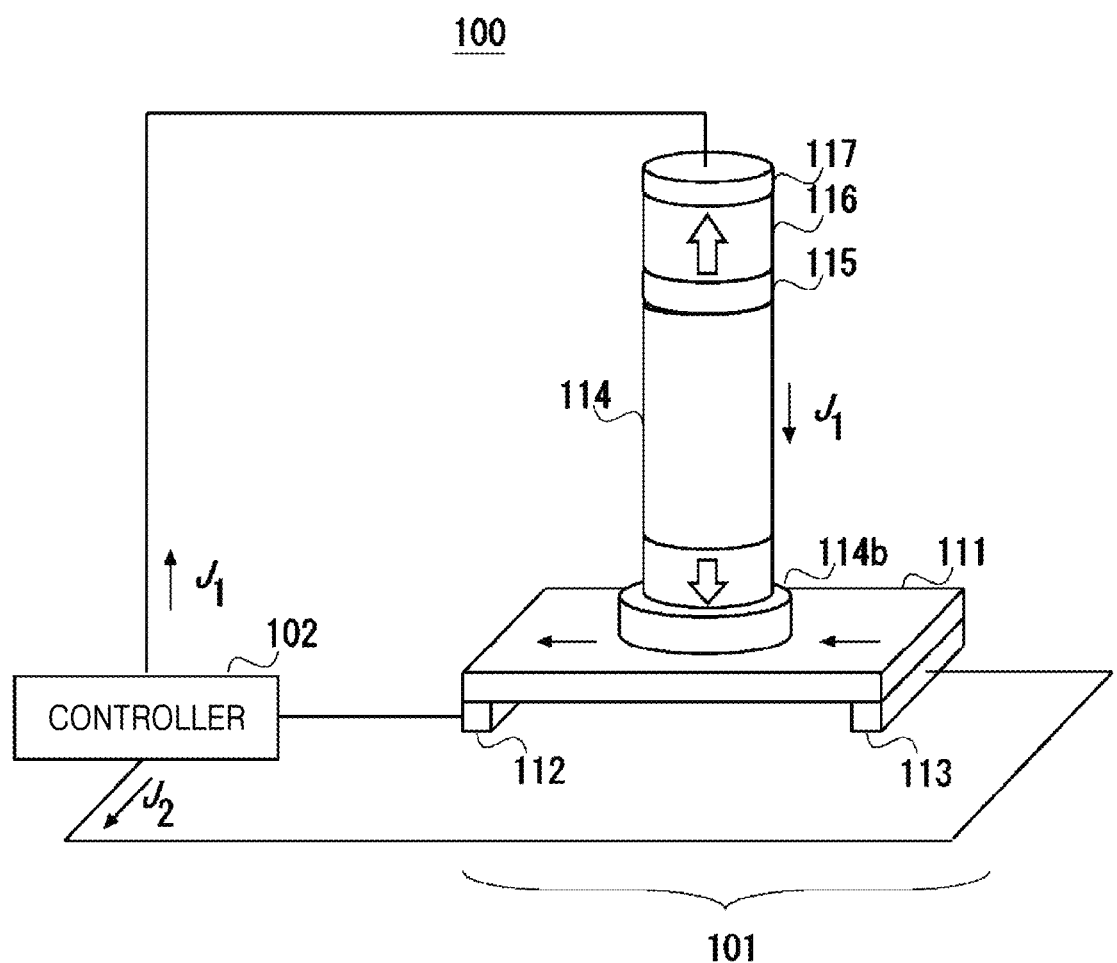
FIGS. 2 to 6 are conceptual diagrams for explaining an operation of the magnetic memory apparatus in FIG. 1.

Referring to FIGS. 2 to 6, an initiation of writing of information of a first bit will be described with reference to FIG. 2.

In FIG. 2, the controller 102 controls a current J2 to flow in a direction corresponding to information of the first bit between the first electrode 112 and the second electrode 113, so that the SOT generator 111 generates a SOT in a direction (mainly, the y axis direction) within the x-y plane in the lower portion 114b of the vertical magnetic recording layer 114. In the example of FIG. 2, the current J2 flows from the second electrode 113 to the first electrode 112, and thus, a magnetic domain wall may be generated in the lower portion 114b of the vertical magnetic recording layer 114.

In addition, the controller 102 controls a current J1 to flow from the third electrode 117 to the first electrode 112, so that the generated magnetic domain wall may move upward from the vertical magnetic recording layer 114.

Figure 3:
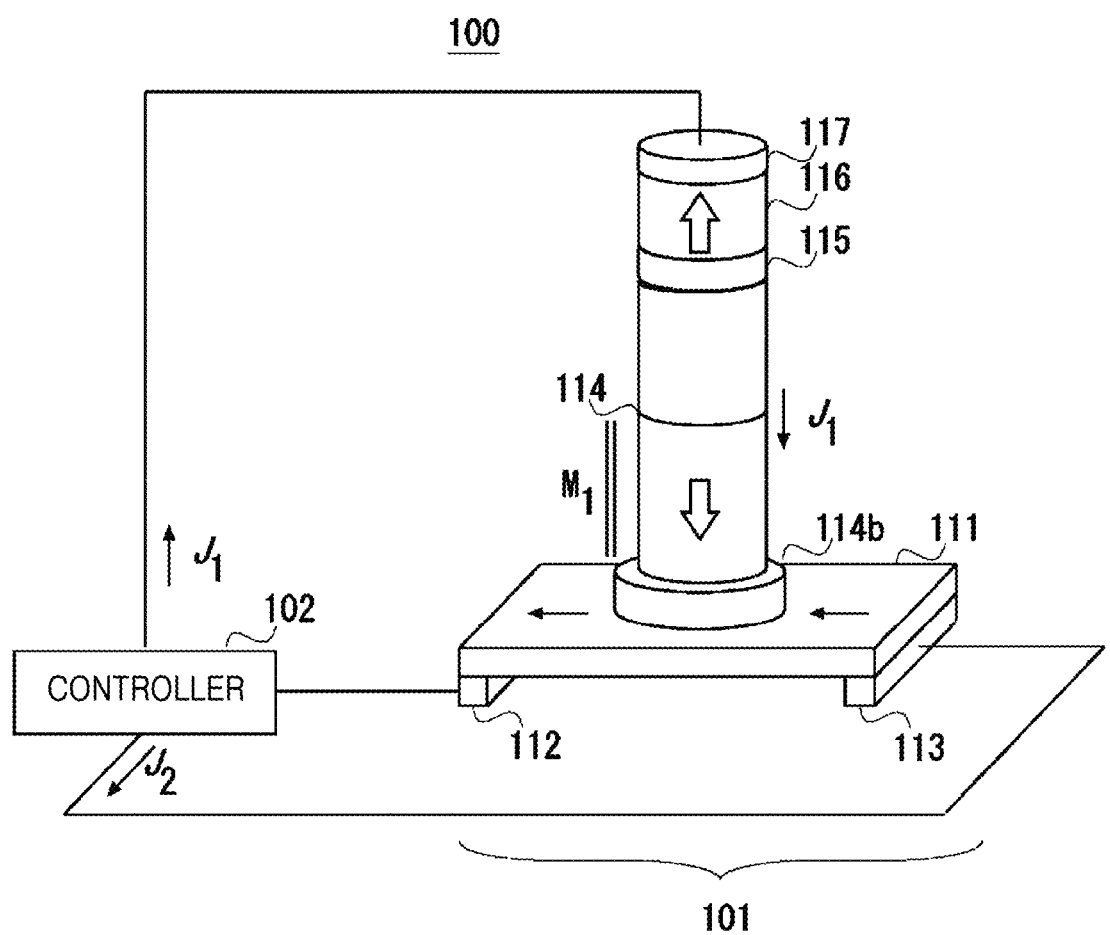

FIG. 3 shows a state in which writing of information of the first bit is completed. As shown in FIG. 3, a downward magnetization M1 may be written in a length of 1 bit in the vertical magnetic recording layer 114. Next, an initiation of writing of information of a second bit will be described with reference to FIG. 4.

Figure 4:
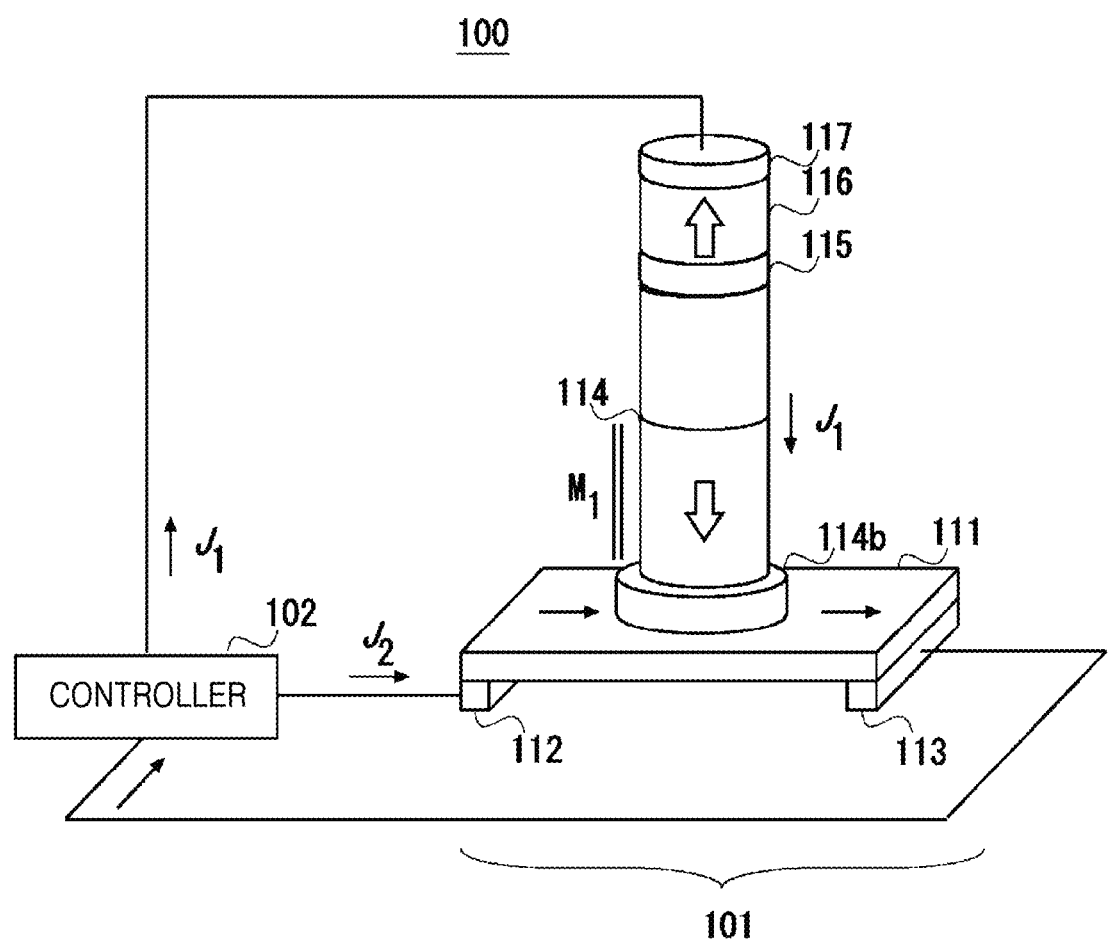
Figure 5:
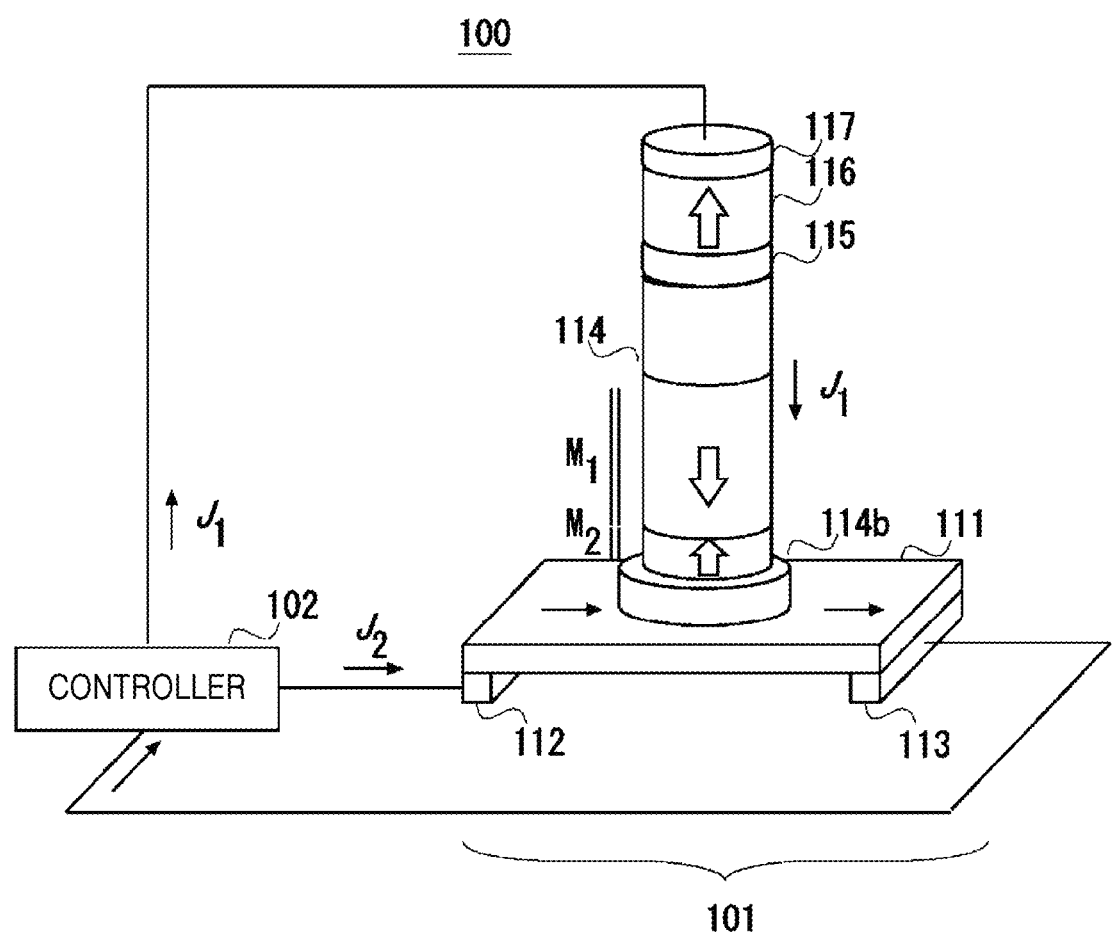

In FIG. 4, the controller 102 may control the current J2 in a direction corresponding to the information of the second bit to flow between the first electrode 112 and the second electrode 113, so that the SOT generator 111 may generate a SOT in the lower portion 114b of the vertical magnetic recording layer 114. In FIG. 4, the current J2 may flow from the first electrode 112 to the second electrode 113. In addition, as shown in FIG. 5, a SOT in a reverse direction of that of FIG. 2 is generated so that a magnetic domain wall may be generated in the lower portion 114b of the vertical magnetic recording layer 114.

Figure 6:
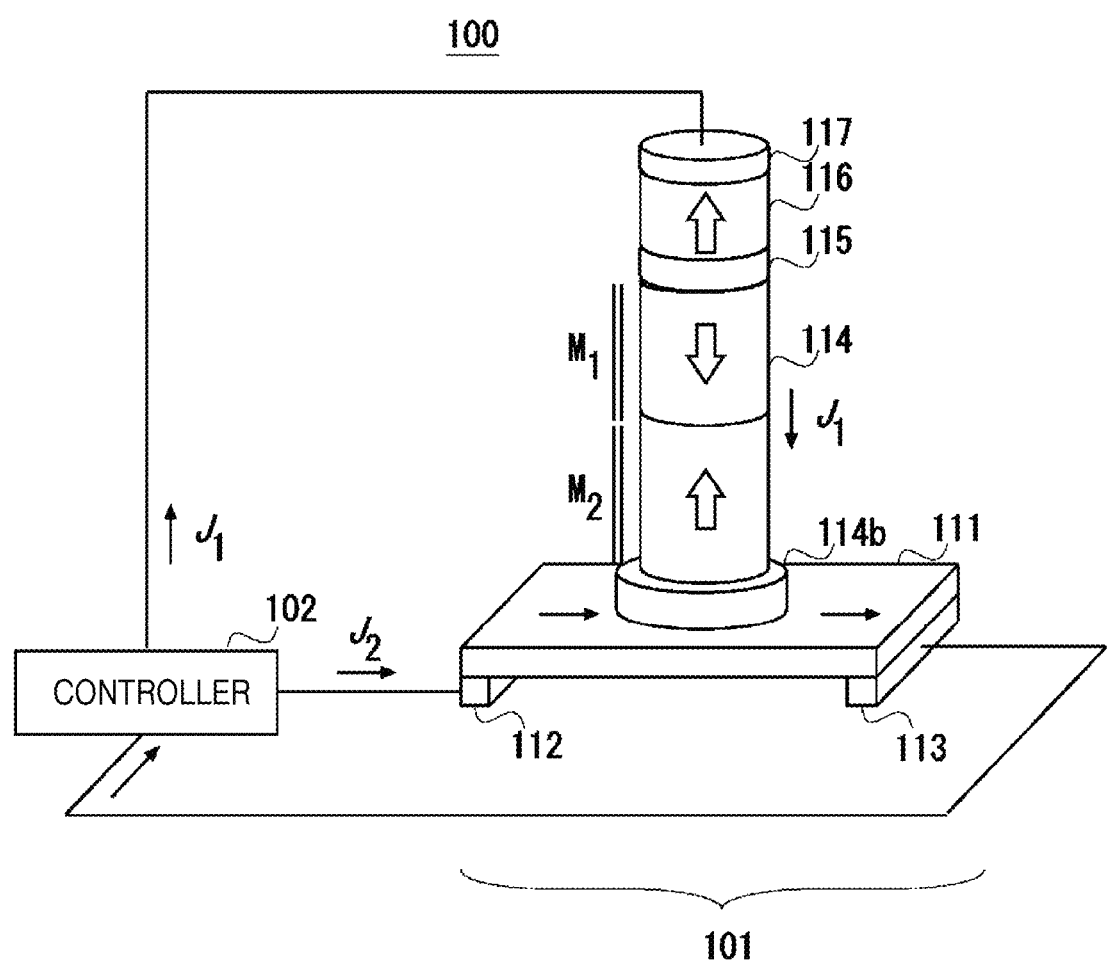

In addition, the controller 102 may control the current J1 to flow from the third electrode 117 to the first electrode 112 so that the downward magnetization M1 corresponding to the information of the first bit may move toward the third electrode 117 side and further, the generated magnetic domain wall may move to the vertical magnetic recording layer 114. In FIG. 6, the downward magnetization M1 of the first bit may move toward the third electrode in the vertical magnetic recording layer 114, and an upward magnetization M2 of the second bit may enter the vertical magnetic recording layer 114. As described above, the controller 102 may write information in the magnetic memory device 101 and move the information within the vertical magnetic recording layer 114. Next, an operation in which the controller 102 reads information from the magnetic memory device 101 and an operation of moving information within the vertical magnetic recording layer 114 will be described.

Figure 7:
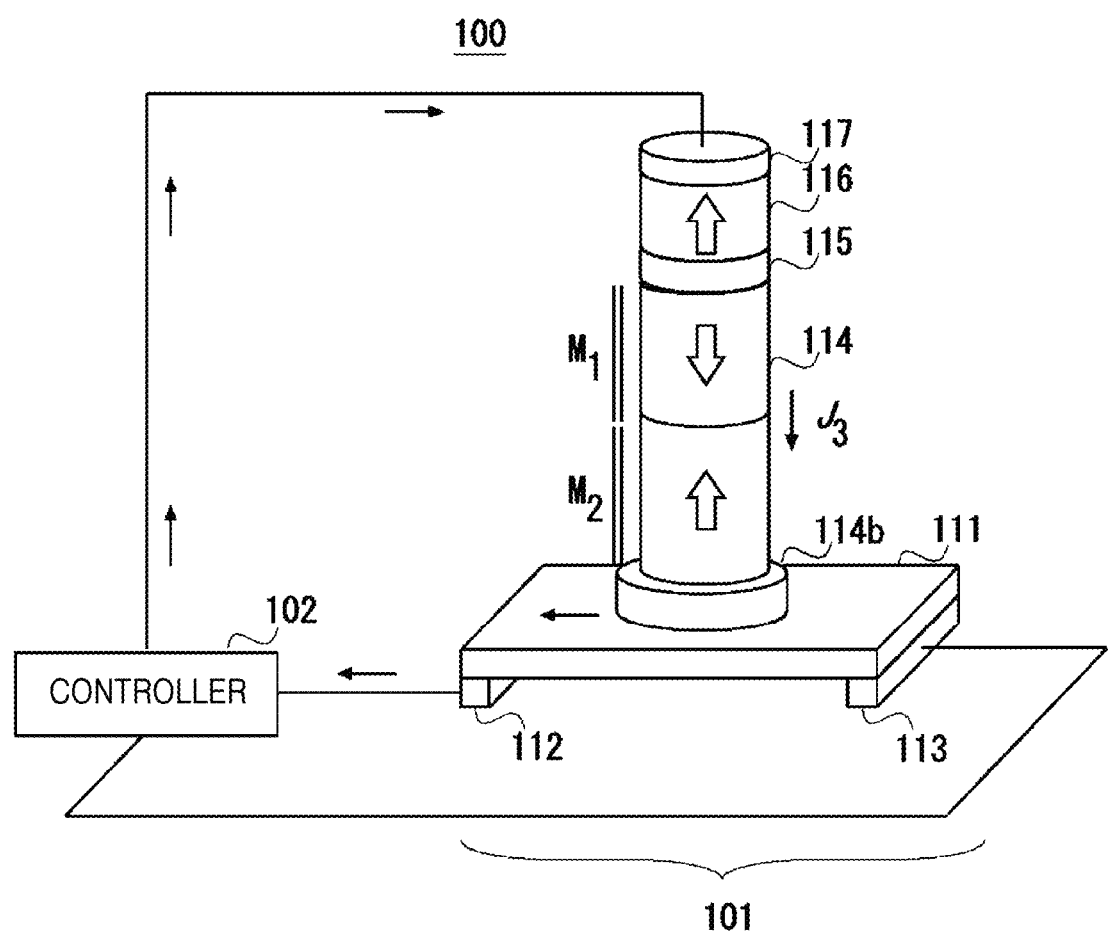
FIG. 7 is a conceptual diagram for explaining an operation of the magnetic memory apparatus in FIG. 1.

FIG. 7 is a conceptual diagram illustrating an operation of the magnetic memory apparatus 100 in FIG. 1. Referring to FIG. 7, the controller 102 applies a voltage between the first electrode 112 and the third electrode 117 and measures a current J3 flowing between the third electrode 117 and the first electrode 112, to thereby read a magnetization direction at an upper end of the vertical magnetic recording layer 114 (e.g., a value of information written in the uppermost portion (on the 115 side) of the vertical magnetic recording layer 114).

In addition, the controller 102 controls a current to flow between the first electrode 112 and the third electrode 117, and measures a voltage (an electric potential difference) between the first electrode 112 and the third electrode 117, to thereby read a magnetization direction of the vertical magnetic recording layer 114 (e.g., a value of information written in the uppermost portion (on the 115 side) of the vertical magnetic recording layer 114).

In addition, the controller 102 may read second information by moving a magnetization of the vertical magnetic recording layer 114 upward with a constant current and moving the second information to the top.

Third information and fourth information may be sequentially read in this way.

In addition, when reading, the controller 102 may control a current not to flow between the first electrode 112 and the second electrode 113 (or may not apply a voltage).

As described above, the magnetic memory apparatus 100 may use the STT and the SOT together to move the magnetic domain wall (the boundary of a section having a certain magnetization direction). Accordingly, the vertical magnetic recording layer 114 may function as a domain wall displacement-type memory. In addition, a calculator experiment using Landau-Lifshitz-Gilbert (LLG) is performed with respect to an operation of the magnetic memory device 101 shown in FIG. 1, and the results are shown in FIGS. 8 to 14 below.

FIGS. 8 to 14 are conceptual diagrams illustrating calculation results using LLG.

Figure 8:
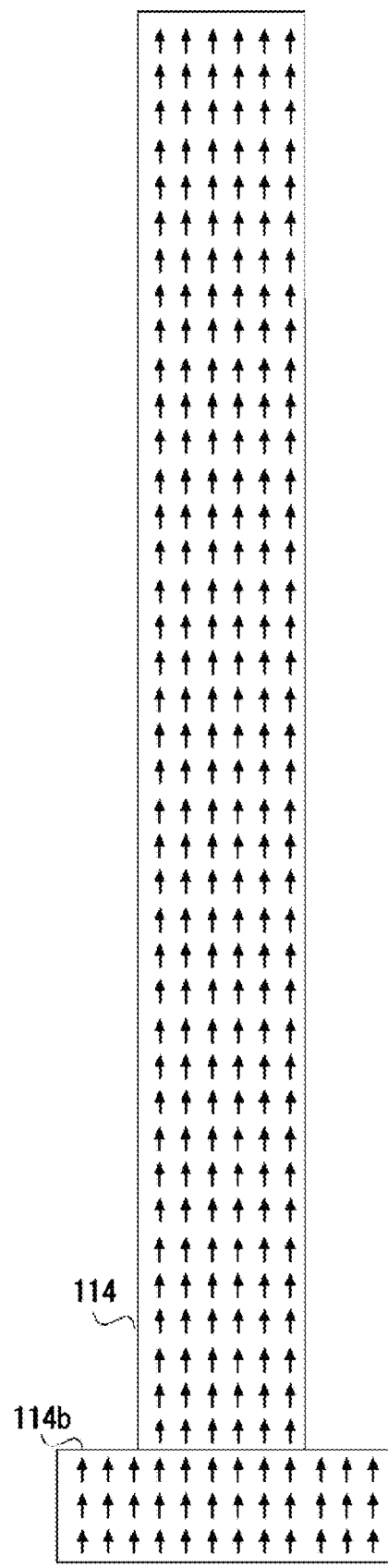
FIGS. 8 to 14 are conceptual diagrams illustrating calculation results using Landau-Lifshitz-Gilbert (LLG)
Figure 9:
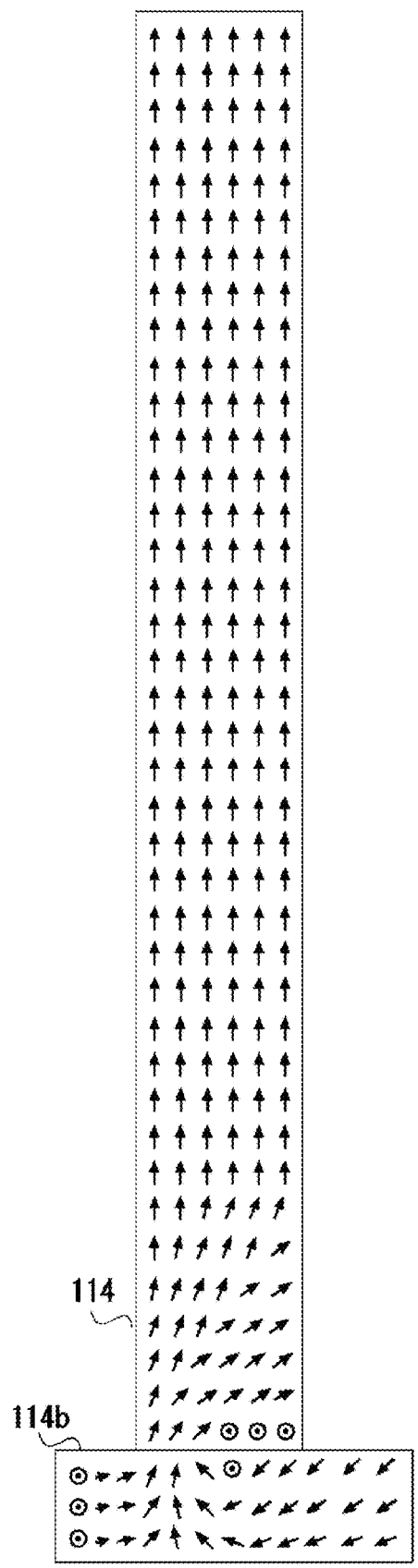
Figure 10:
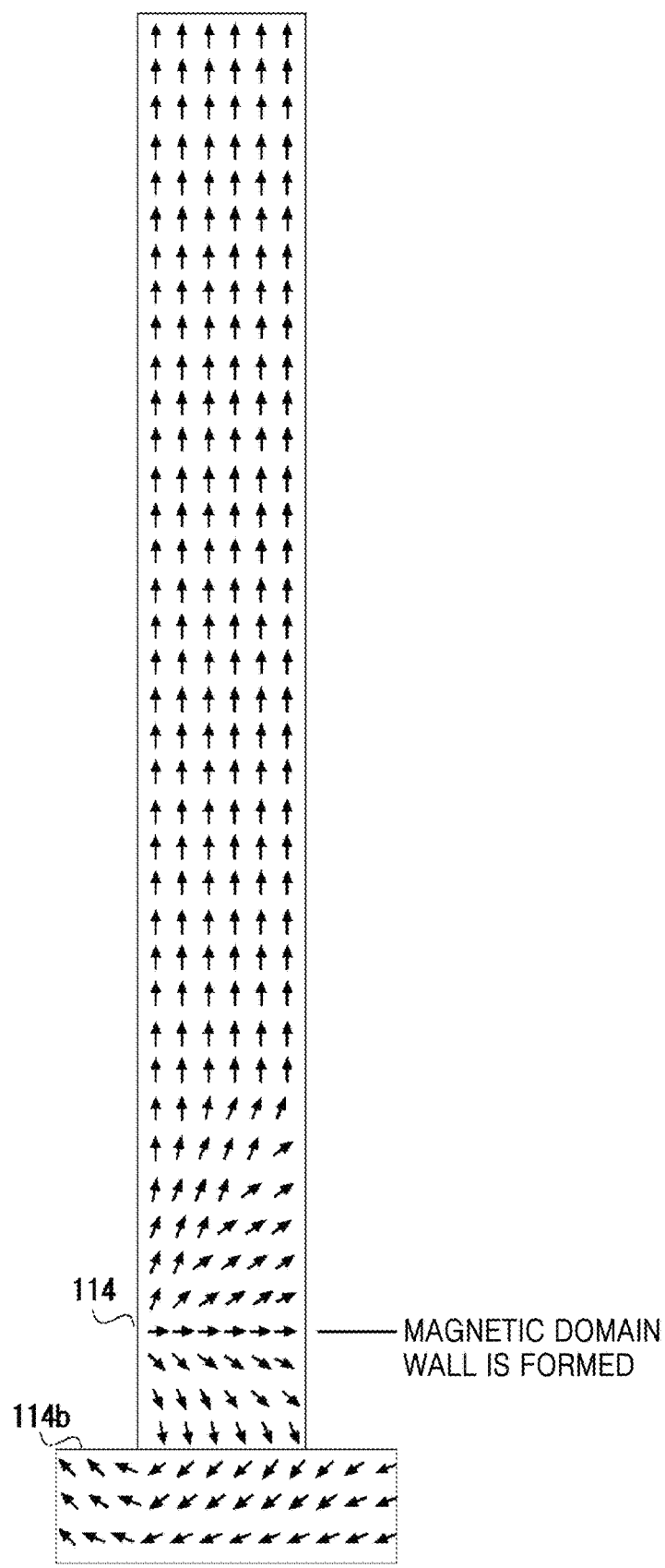
Figure 11:
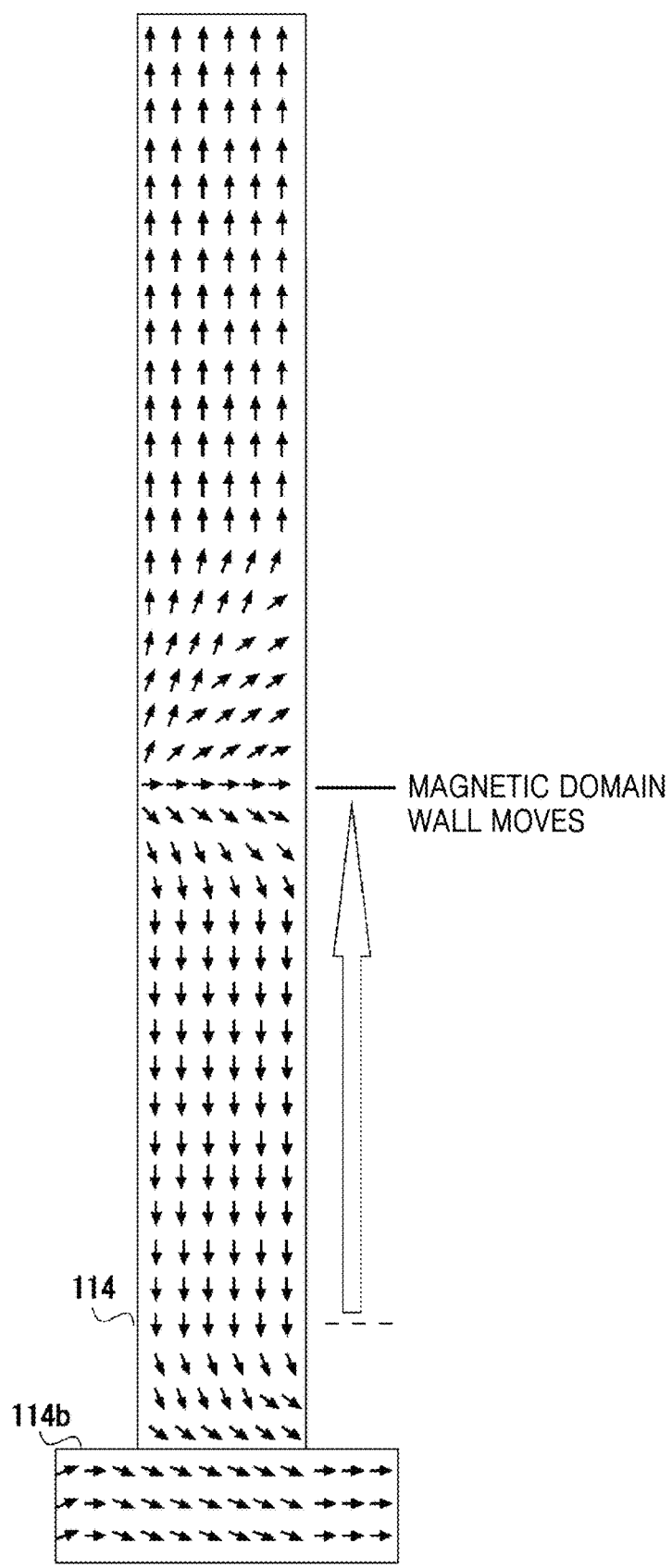

Referring to FIGS. 8 to 14, as shown in FIGS. 8 to 10, by the SOT generated from the SOT generator (see 111 of FIG. 1), a magnetization direction of the lower portion 114b of the vertical magnetic recording layer 114 may be changed, and a magnetic domain wall may be formed. In addition, as shown in FIGS. 10 and 11, the magnetization domain wall may move in the vertical magnetic recording layer 114.

Figure 12:
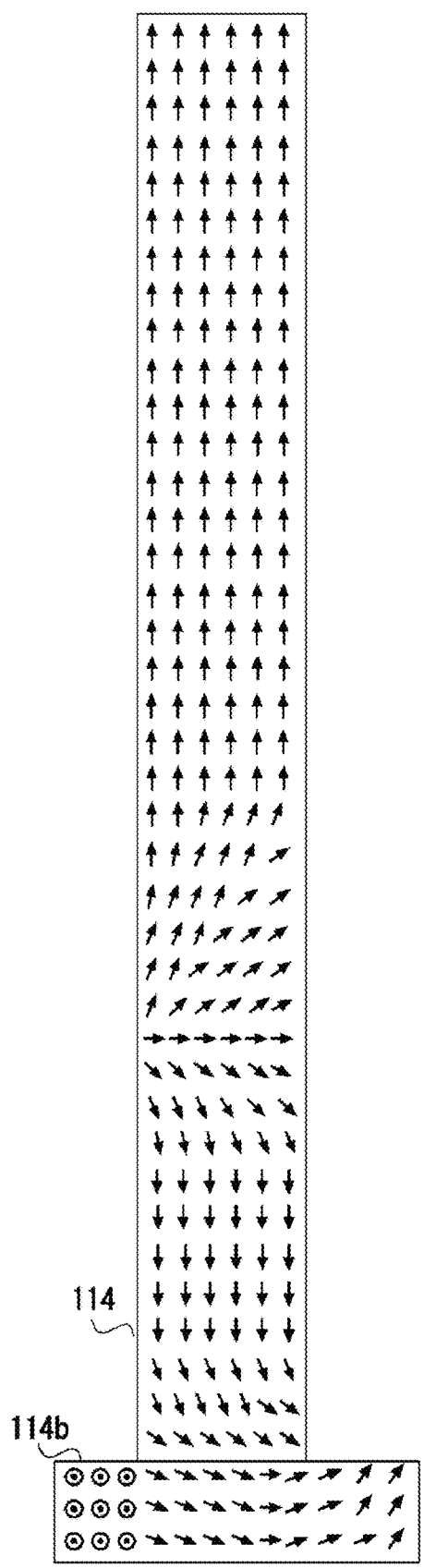
Figure 13:
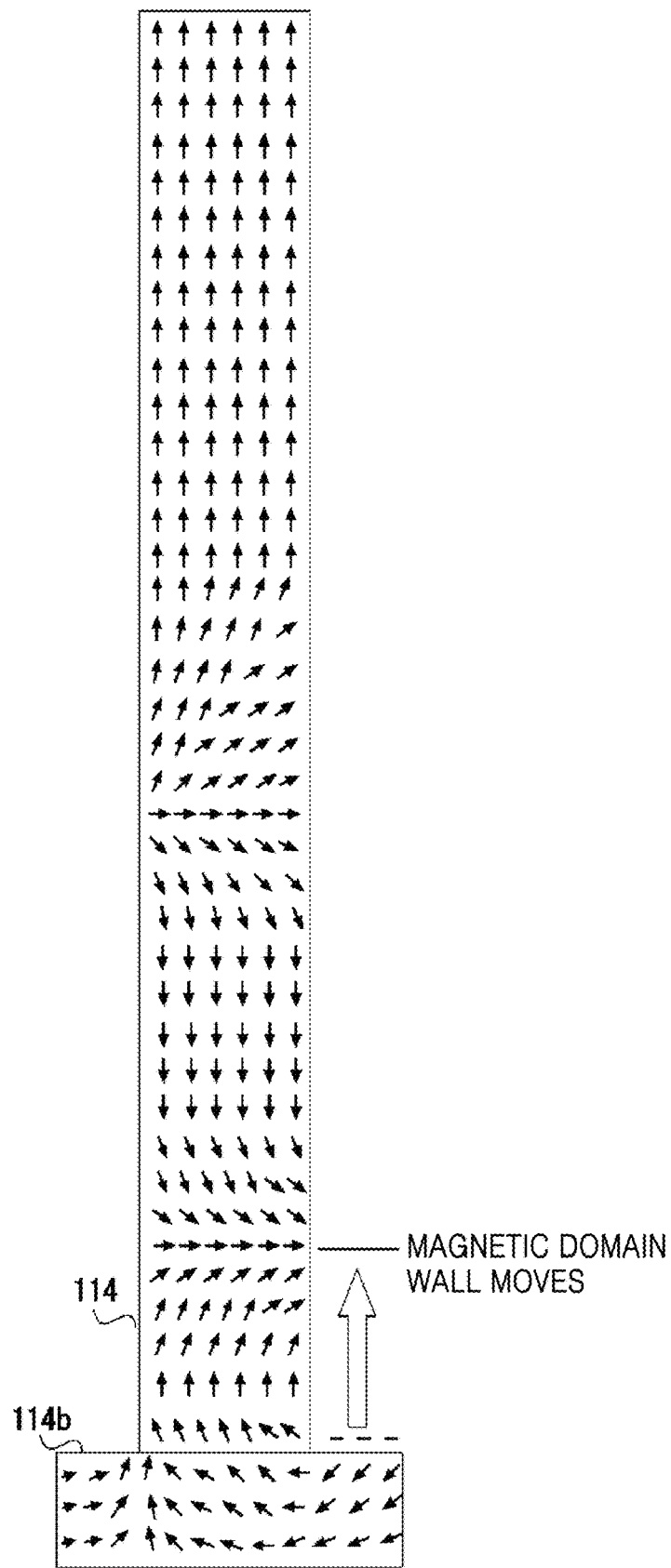
Figure 14:
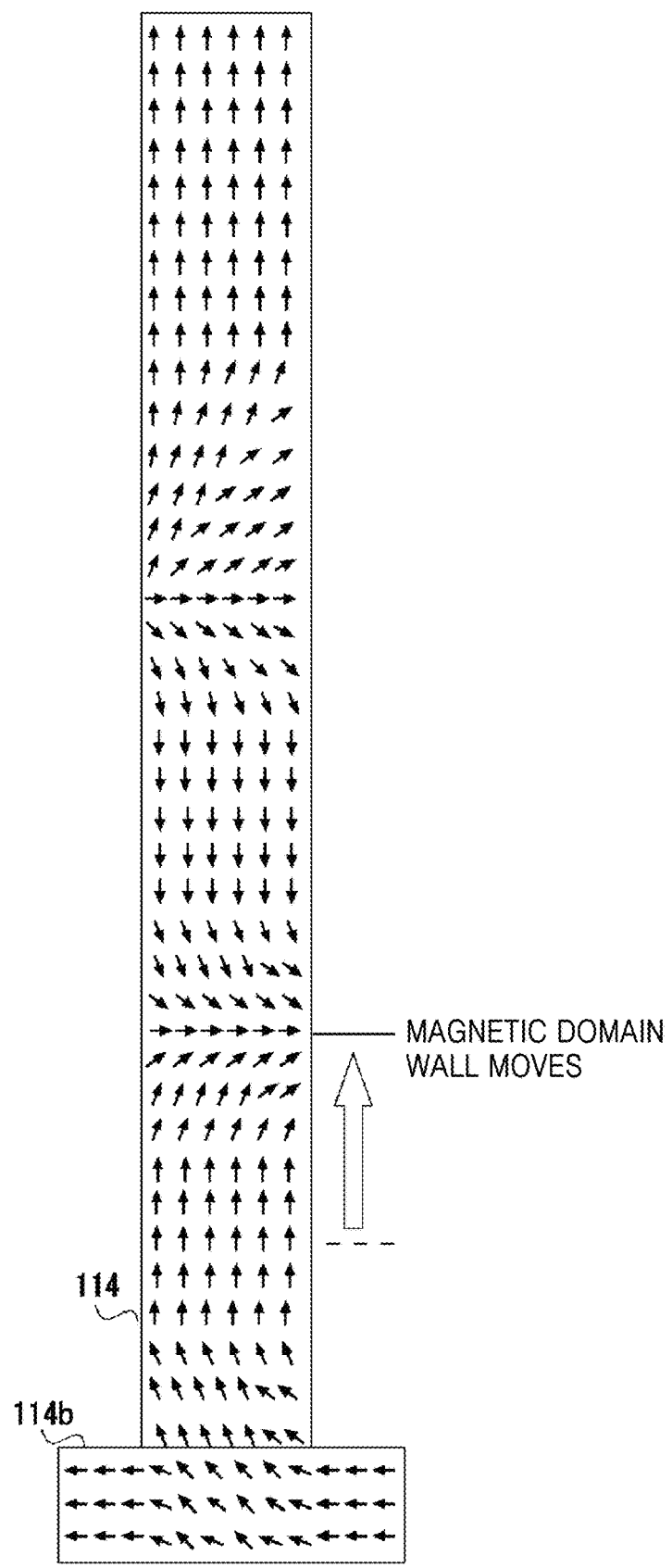

Similarly, as shown in FIGS. 12 to 14, the magnetic domain wall may move in the vertical magnetic recording layer 114.

As described above, it may be understood that data may be written and moved by generating SOT in the lower portion 114b of the vertical magnetic recording layer 114 and passing a current through the vertical magnetic recording layer 114.

Figure 15A:
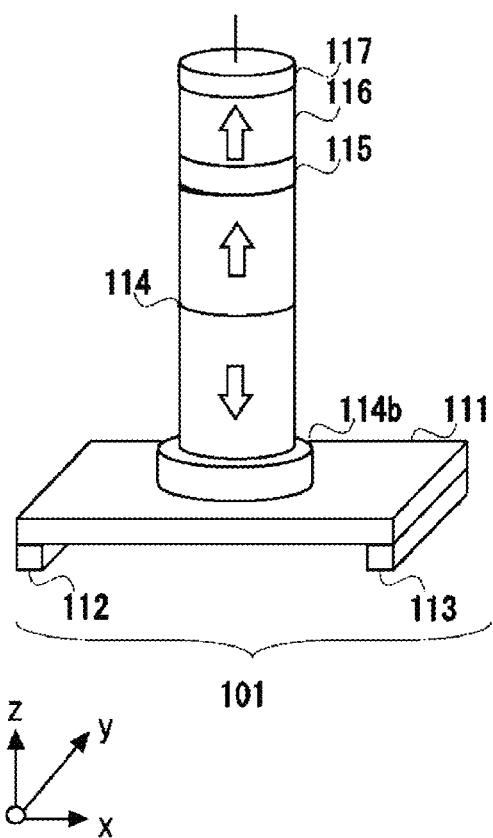
FIGS. 15A to 15C are cross-sectional views illustrating an example of information writing in the magnetic memory apparatus in FIG. 1.
Figure 15B:
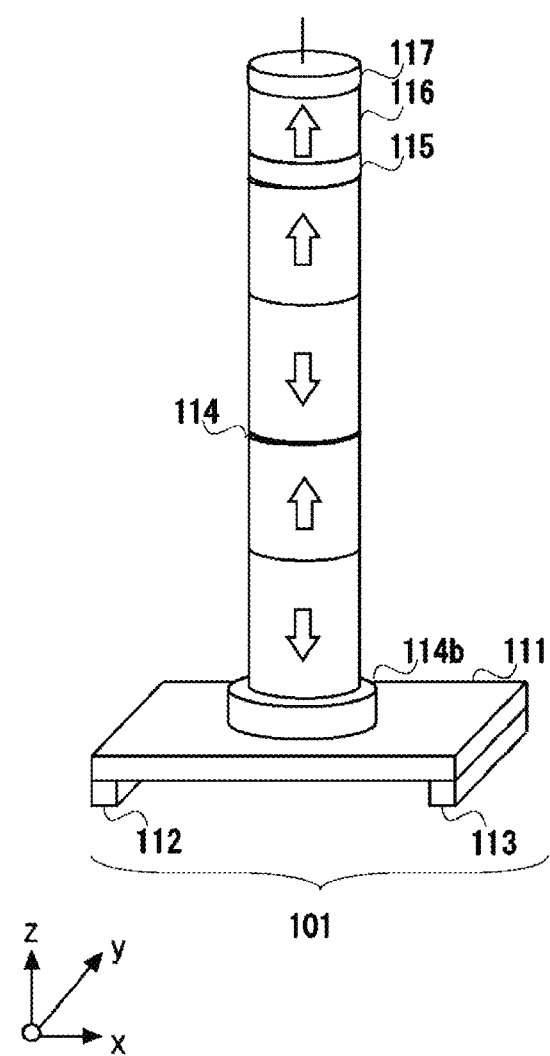
Figure 15C:
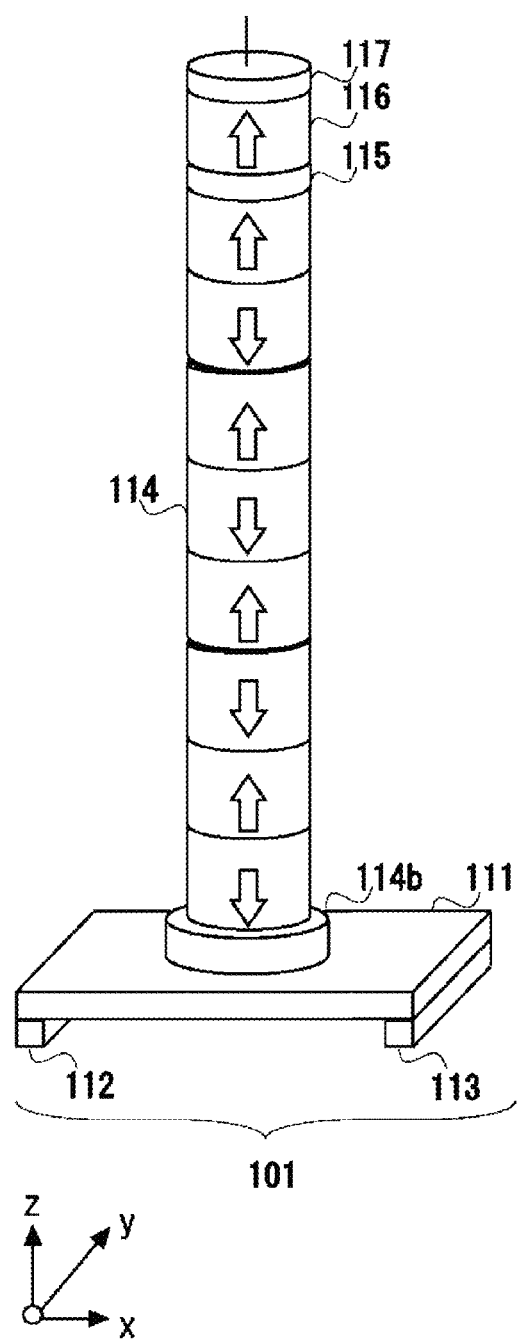

According to the magnetic memory apparatus 100 of inventive concepts, by using a SOT line and a pillar-type vertical magnetic recording layer, a highly-integrated, large-capacity, highly-reliable magnetic device including a next-generation three-terminal MTJ device capable of writing information, moving the information by a current, reading the information using an MTJ, and enabling multi-value may be provided. In addition, in a three-terminal MTJ device structure using a SOT according to the related art, only 1-bit information may be written and read, but according to the magnetic memory device of inventive concepts, a plurality of pieces of data may be written, moved, and read by a three-terminal structure. In addition, the vertical magnetic recording layer 114 may have a multi-value structure for writing a plurality of pieces of information. FIGS. 15A to 15C are cross-sectional views illustrating an example of writing information in the magnetic memory apparatus in FIG. 1.

Referring to FIGS. 15A to 15C, FIG. 15A shows an example in which 2-bit information is written in the vertical magnetic recording layer 114.

In addition, FIG. 15B is an example in which 4-bit information is written in the vertical magnetic recording layer 114. In addition, FIG. 15C is an example in which 8-bit information is written in the vertical magnetic recording layer 114.

As described above, information of a plurality of bits may be written in the vertical magnetic recording layer 114.

Figure 16:
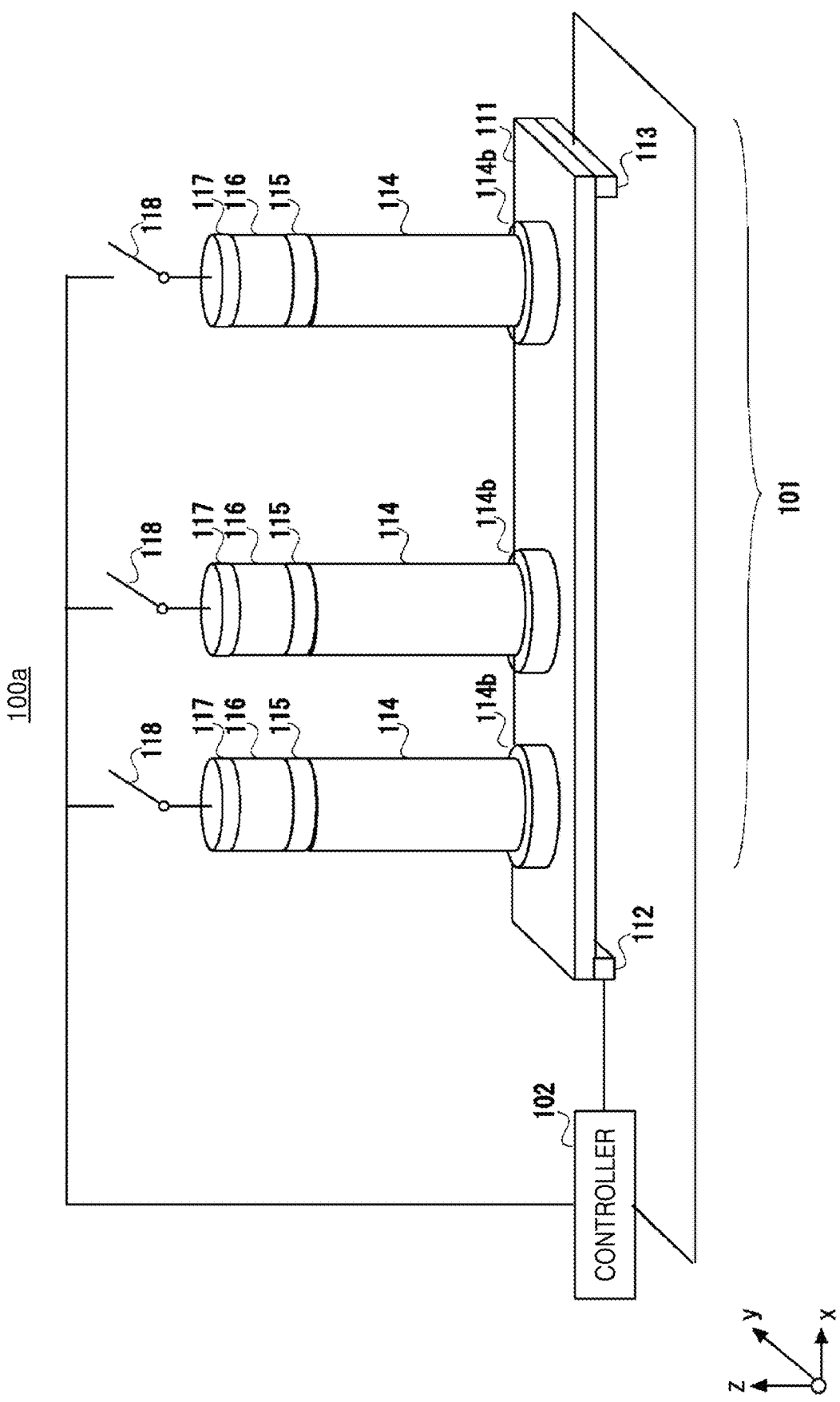
FIG. 16 is a perspective view of a magnetic memory apparatus according to an embodiment.

In addition, a plurality of laminates of the first electrode 112, the second electrode 113, the vertical magnetic recording layer 114, the insulating layer 115, the fixed layer 116, and the third electrode 117 may be provided in one SOT generator 111. FIG. 16 is a perspective view of a magnetic memory apparatus 100a according to an embodiment. Referring to FIG. 16, in the magnetic memory apparatus 100a of inventive concepts, each of a plurality of third electrodes 117 may be connected to the controller 102 through a switch 118.

As shown in FIG. 16, the plurality of laminates of the first electrode 112, the second electrode 113, the vertical magnetic recording layer 114, the insulating layer 115, the fixed layer 116, and the third electrode 117 may be commonly connected to one SOT generator 111.

In addition, by opening and closing the switch 118, the number of vertical magnetic recording layers in which information is to be written may be selected.

The technical ideas of inventive concepts are not limited to the form of the embodiments described above, and appropriate changes may be made without departing from the spirit of inventive concepts.

In the embodiments described above, an example in which the vertical magnetic recording layer 114, the insulating layer 115, and the fixed layer 116 constitute the TMR device is described, but a non-magnetic metal layer may be stacked instead of the insulating layer 115 to constitute a GMR device. In addition, in the form of the embodiments described above, for example, in FIGS. 1 and 16, the vertical magnetic recording layer 114 and 114b, the insulating layer 115, and the fixed layer 116 are shown in a cylindrical shape, but they may be in any form. For example, the stack may be in a rectangular parallelepiped shape.

A magnetic memory apparatus according to an embodiment of inventive concepts includes a SOT generator generating a SOT, and a vertical magnetic recording layer connected to a main surface of the SOT generator at one end thereof, and a direction of a SOT generated by the SOT generator and a direction in which the vertical magnetic recording layer extends may be perpendicular to each other. The magnetic memory apparatus according to an embodiment of inventive concepts may implement a high-density, large-capacity, and highly-reliable magnetic device having a function of a next generation three-terminal non-volatile memory capable of writing information, moving the information by a current, reading the information using an MTJ, and enabling multi-value.

The magnetic memory apparatus according to an embodiment of inventive concepts may include a vertical magnetic recording layer, a non-magnetic insulating layer stacked at one end of the vertical magnetic recording layer in an extension direction of the vertical recording layer, and a fixed layer stacked on the non-magnetic insulating layer in the extension direction of the vertical magnetic recording layer. In the magnetic memory apparatus according to an embodiment of inventive concepts, information reading may be realized by a tunneling magnetoresistance (TMR) device.

The magnetic memory apparatus according to an embodiment of inventive concepts may also include a vertical magnetic recording layer, a non-magnetic metal layer stacked at the other end of the vertical magnetic recording layer, and a fixed layer stacked on the non-magnetic metal layer.

The magnetic memory apparatus according to an embodiment of inventive concepts is a three-terminal device, and uses a long recording layer having magnetic anisotropy, and thus, it provides a new magnetic memory device capable of large capacity and multi-value in which information reading may be realized by the TMR device, and may be largely different from MTJ devices currently being commercialized and developed.

The magnetic memory apparatus according to an embodiment of inventive concepts is a high-density, large-capacity, and highly-reliable magnetic device of a next generation three-terminal MTJ device capable of writing information, moving the information with a current, reading the information using an MTJ, and enabling multi-value, and may realize the reading of information with a GMR device.

The magnetic memory apparatus according to an embodiment of the present disclosure includes a SOT generator of which a main surface is connected to the other end of the vertical magnetic recording layer, and a direction of a SOT generated by the SOT generator and a direction in which the vertical magnetic recording layer extends may be perpendicular to each other.

In the magnetic memory apparatus according to an embodiment of inventive concepts, the information may be written in the vertical magnetic recording layer.

The magnetic memory apparatus according to an embodiment of inventive concepts may include a first electrode and a second electrode that passes a current through the SOT generator in a direction perpendicular to the direction of SOT, and a third electrode connected to the fixed layer and passing a current through the vertical magnetic recording layer.

The magnetic memory apparatus according to an embodiment of inventive concepts may read and move a plurality of pieces of information written in the vertical magnetic recording layer.

The magnetic memory apparatus according to an embodiment of inventive concepts may include the magnetic memory device, and a controller that passes a current in a direction corresponding to information written between the first electrode and the second electrode.

The magnetic memory apparatus according to an embodiment of inventive concepts may write the information in the vertical magnetic recording layer as a magnetic domain.

In the magnetic memory apparatus according to an embodiment of inventive concepts, the controller may control a current to flow between the first electrode and the third electrode to move the magnetic domain within the vertical magnetic recording layer.

The magnetic memory apparatus according to an embodiment of inventive concepts may record and move a plurality of pieces of information in the vertical magnetic recording layer.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While inventive concepts have been particularly shown and described with reference to embodiments thereof, it will be understood that various changes in form and details may be made therein without departing from the spirit and scope of the following claims.

What is claimed is:

1. A magnetic memory device comprising:
    a vertical magnetic recording layer extending vertically, which a length of a vertical extension direction thereof is two times or more a cross-sectional length of the vertical magnetic recording layer in a direction perpendicular to the vertical extension direction;
    an insulating layer on an upper surface of the vertical magnetic recording layer in the vertical extension direction; and
    a fixed layer on the insulating layer in the vertical extension direction.

2. The magnetic memory device of claim 1, further comprising:
    a spin orbit torque (SOT) generator connected to a lower surface of the vertical magnetic recording layer, wherein
    the SOT generator is configured to generate a SOT in a direction perpendicular to the vertical extension direction of the vertical magnetic recording layer.

3. The magnetic memory device of claim 2, further comprising:
    a first electrode and a second electrode connected to the SOT generator and configured to pass a current through the SOT generator in a direction perpendicular to the direction of the SOT; and
    a third electrode connected to the fixed layer and configured to pass a current through the vertical magnetic recording layer.

4. The magnetic memory device of claim 3, wherein
    by a flow of the current in the SOT generator between the first electrode and the second electrode, the magnetic memory device is configured to generate a SOT and a magnetic domain wall in a lower portion of the vertical magnetic recording layer, and
    by a flow of the current in the vertical magnetic recording layer between the third electrode and the first electrode, the magnetic memory device is configured to move the magnetic domain wall in the vertical magnetic recording layer.

5. The magnetic memory device of claim 2, wherein the SOT generator includes a topological insulator.

6. The magnetic memory device of claim 5, wherein
    the SOT generator includes BiTeSb or BiSb as the topological insulator, and
    the SOT generator includes at least one of rhodium (Rh), platinum (Pt), tungsten (W), and tantalum (Ta).

7. The magnetic memory device of claim 2, wherein
at least two laminates are on the SOT generator, and
each of the at least two laminates includes the vertical magnetic recording layer, the insulating layer, and the fixed layer.

8. The magnetic memory device of claim 7, further comprising:
a controller connected to each of the at least two laminates through a switch, wherein
the controller is configured to control an application of current to the at least two laminates using the switch.

9. The magnetic memory device of claim 1, wherein
the vertical magnetic recording layer includes a pillar-type vertical magnetic recording layer and includes a ferromagnetic metal, and
the vertical magnetic recording layer is configured to operate as a magnetic domain wall displacement-type memory in which a magnetic wall moves by a current flow.

10. The magnetic memory device of claim 9, wherein the vertical magnetic recording layer has a multi-value structure configured to write a plurality of pieces of information.

11. The magnetic memory device of claim 1, wherein the vertical magnetic recording layer, the insulating layer, and the fixed layer are part of a tunneling magnetoresistance (TMR) device.

12. A magnetic memory device comprising:
a vertical magnetic recording layer extending vertically, in which a length of a vertical extension direction thereof is two times or more a cross-sectional length of the vertical magnetic recording layer in a direction perpendicular to the vertical extension direction;
a non-magnetic metal layer on an upper surface of the vertical magnetic recording layer in the vertical extension direction; and
a fixed layer on the non-magnetic metal layer in the vertical extension direction.

13. The magnetic memory device of claim 12, further comprising:
a spin orbit torque (SOT) generator connected to a lower surface of the vertical magnetic recording layer, the SOT generator configured to generate a SOT;
a first electrode and a second electrode configured to pass a current through the SOT generator in a direction perpendicular to a direction of the SOT; and
a third electrode connected to the fixed layer and configured to pass a current through the vertical magnetic recording layer.

14. The magnetic memory device of claim 12, wherein the vertical magnetic recording layer, the non-magnetic metal layer, and the fixed layer are part of a giant magnetoresistance (GMR) device.

15. The magnetic memory device of claim 12, wherein
the vertical magnetic recording layer includes a pillar-type vertical magnetic recording layer and includes a ferromagnetic metal, and
the vertical magnetic recording layer is configured to operate as a magnetic domain wall displacement-type memory in which a magnetic wall moves by a current flow.

16. A magnetic memory apparatus comprising:
a magnetic memory device including,
a vertical magnetic recording layer in which a length of an extension direction thereof is two times or more a cross-sectional length of the vertical magnetic recording layer in a direction perpendicular to the extension direction,
a non-magnetic layer on an upper surface of the vertical magnetic recording layer in the extension direction,
a fixed layer on the non-magnetic layer in the extension direction,
a spin orbit torque (SOT) generator connected to a lower surface of the vertical magnetic recording layer and configured to generate a SOT,
a first electrode and a second electrode connected to the SOT generator and configured to pass a current through the SOT generator in a direction perpendicular to a direction of the SOT, and
a third electrode connected to the fixed layer and configured to pass a current through the vertical magnetic recording layer; and
a controller, the controller being configured to control a current to flow in a direction corresponding to write information between the first electrode and the second electrode.

17. The magnetic memory apparatus of claim 16, wherein the controller is configured to control a current that moves a magnetic domain wall within the vertical magnetic recording layer between the first electrode and the third electrode.

18. The magnetic memory apparatus of claim 16, wherein
the non-magnetic layer includes an insulating layer or a metal layer, and
the magnetic memory device includes a tunneling magnetoresistance (TMR) device based on the insulating layer or a giant magnetoresistance (GMR) device based on the metal layer.

19. The magnetic memory apparatus of claim 16, wherein
the SOT generator includes BiTeSb or BiSb as a topological insulator, and
the SOT generator includes at least one of rhodium (Rh), platinum (Pt), tungsten (W), and tantalum (Ta).

20. The magnetic memory apparatus of claim 16, wherein
the magnetic memory device includes at least two laminates on the SOT generator,
each of the at least two laminates includes the vertical magnetic recording layer, the non-magnetic layer, and the fixed layer, and
each of the at least two laminates are connected to the controller through a switch.

* * * * *